United States Patent
Chuang et al.

(10) Patent No.: US 9,509,989 B2
(45) Date of Patent: Nov. 29, 2016

(54) METHOD AND APPARATUS FOR REORDERED BINARIZATION OF SYNTAX ELEMENTS IN CABAC

(75) Inventors: Tzu-Der Chuang, Hsinchu (TW); Ching-Yeh Chen, Taipei (TW); Yu-Wen Huang, Taipei (TW)

(73) Assignee: HFI INNOVATION INC., Zhubei, Hsinchu County (TW)

(*) Notice: Subject to any disclaimer, the term of this patent is extended or adjusted under 35 U.S.C. 154(b) by 242 days.

(21) Appl. No.: 14/234,151

(22) PCT Filed: Aug. 2, 2012

(86) PCT No.: PCT/CN2012/079538
§ 371 (c)(1),
(2), (4) Date: Jan. 22, 2014

(87) PCT Pub. No.: WO2013/017092
PCT Pub. Date: Feb. 7, 2013

(65) Prior Publication Data
US 2014/0192861 A1    Jul. 10, 2014

Related U.S. Application Data

(60) Provisional application No. 61/514,986, filed on Aug. 4, 2011.

(51) Int. Cl.
*H04N 19/10* (2014.01)
*H04N 19/21* (2014.01)
(Continued)

(52) U.S. Cl.
CPC ..... *H04N 19/00393* (2013.01); *H03M 7/4018* (2013.01); *H04N 19/436* (2014.11); *H04N 19/70* (2014.11); *H04N 19/88* (2014.11); *H04N 19/91* (2014.11)

(58) Field of Classification Search
None
See application file for complete search history.

(56) References Cited

U.S. PATENT DOCUMENTS 8,976,861 B2 * 3/2015 Rojals ............... H03M 7/4018
                                                   375/240.02
9,258,571 B2 * 2/2016 Seregin ............... H04N 19/91
(Continued)

FOREIGN PATENT DOCUMENTS

CN          100466739          3/2009

OTHER PUBLICATIONS

Vadim et al., "Binarization modification for last position coding", JCTVC-F375, Jul. 2011.*
(Continued)

*Primary Examiner* — Tracy Y Li
*Assistant Examiner* — Mohammad J Rahman
(74) *Attorney, Agent, or Firm* — McClure, Qualey & Rodack, LLP (57) ABSTRACT

A method and apparatus of context-based adaptive binary arithmetic encoding/decoding for syntax elements of one or more blocks are disclosed. According to one embodiment of the present invention, the binarization results of the x and y positions of the last significant coefficient of a transform unit are reordered by collecting the bypass bins together. According to another embodiment of the present invention, binarization results of syntax elements from two or more of four Intra N×N prediction units, including prev_intra_luma_pred_flag, rem_intra_luma_pred_mode, and mpm_idx are reordered by collecting the bypass bins together. In yet another embodiment according to the present invention, the binarization results of other syntax elements are also reordered by collecting bypass bins together. Furthermore, the above reordering of binarization results may be used for binarization results corresponding to a block and its neighboring blocks.

8 Claims, 8 Drawing Sheets

(51) Int. Cl.
  *H04N 19/60*   (2014.01)
  *H04N 19/70*   (2014.01)
  *H03M 7/40*    (2006.01)
  *H04N 19/88*   (2014.01)
  *H04N 19/436*  (2014.01)
  *H04N 19/91*   (2014.01)

(56) References Cited

U.S. PATENT DOCUMENTS

| | | | |
|---|---|---|---|
| 2005/0012648 A1  | 1/2005 | Marpe et al. | |
| 2005/0018845 A1* | 1/2005 | Suzaki | G06T 1/0028 380/243 |
| 2007/0030180 A1* | 2/2007 | Yang | H03M 7/4006 341/50 |
| 2007/0080832 A1* | 4/2007 | Yang | H03M 7/4006 341/50 |
| 2008/0246637 A1* | 10/2008 | Chen | H03M 7/4006 341/51 |
| 2009/0089549 A1* | 4/2009 | Liu | H03M 7/4006 712/208 |
| 2009/0096643 A1* | 4/2009 | Chang | H03M 7/4006 341/51 |
| 2011/0001643 A1* | 1/2011 | Sze | H03M 7/4006 341/87 |
| 2012/0140813 A1* | 6/2012 | Sole Rojals | H03M 7/4018 375/240.02 |
| 2012/0140814 A1* | 6/2012 | Sole Rojals | H03M 7/4018 375/240.02 |
| 2012/0163456 A1* | 6/2012 | Coban | H04N 19/176 375/240.13 |
| 2012/0169519 A1* | 7/2012 | Ugur | H04N 19/91 341/55 |
| 2012/0177107 A1* | 7/2012 | Fu | H04N 19/61 375/240.03 |
| 2012/0287989 A1* | 11/2012 | Budagavi | G06F 17/147 375/240.03 |
| 2012/0300839 A1* | 11/2012 | Sze | H04N 19/91 375/240.12 |
| 2013/0022119 A1* | 1/2013 | Chien | H04N 19/159 375/240.16 |
| 2013/0028334 A1* | 1/2013 | Bossen | H03M 7/4018 375/240.25 |
| 2013/0243102 A1* | 9/2013 | Bossen | H03M 7/4006 375/240.25 |
| 2014/0140400 A1* | 5/2014 | George | H04N 19/52 375/240.12 |

OTHER PUBLICATIONS

Marpe et al., "Context-Based Adaptive Binary Arithmetic Coding in the H.264/AVC Video Compression Standard", Jul. 2003.*
Sze et al., "High Throughput CABAC Entropy Coding in HEVC", IEEE Transactions on Circuits and Systems for Video Technology, vol. 22, No. 12, Dec. 2012.*
Wei Yu and Yun He, "A high performance CABAC decoding architecture," in IEEE Transactions on Consumer Electronics, vol. 51, No. 4, pp. 1352-1359, Nov. 2005.*
Chien, et al.: "Intra mode coding for INTRA_NxN"; Joint Collaborative Team on Video Coding (JCT-VC) of ITU-T SG 16 WP 3 and ISO/IEC JTC 1/SC 29/WG 11; 9th Meeting: Geneva, CH, Apr. 27-May 7, 2012; pp. 1-4.
C. Rosewame: "Intra-mode bypass parallelism (IMBP)"; Joint Collaborative Team on Video Coding (.JCT-VC) of ITU-T SG16 WP3 and ISO/IEC JTC1/SC29/WG11; 8th Meeting: San Jose, CA, USA, Feb. 1-10, 2012; pp. 1-16.
Vivienne Sze: "Parallel Context Processing of Coefficient Level"; Joint Collaborative Team on Video Coding (JCT-VC) of ITU-T SG16 WP3 and ISO/IEC JTC1/SC29/WG11; 6th Meeting: Torino, IT, Jul. 14-22, 2011; pp. 1-4.
Sasai, H., et al.; "Modified MVD coding for CABAC;" Joint Collaborative Team on Video Coding (JCT-VC) of ITU-T SG16 WP3 and ISO/IEC JTC1/SC29/WG11; Jul. 2011; pp. 1-4.

* cited by examiner

*Fig. 1*

|  | Value | Regular mode | Bypass mode |
|---|---|---|---|
| last_significant_coeff_x | 7 | 0000 | 11 |
|  |  | regular_x | bypass_x |
| last_significant_coeff_y | 6 | 0000 | 10 |
|  |  | regular_y | bypass_y |

*Fig. 2*

| 0000 | 11 | 0000 | 10 |
|---|---|---|---|
| regular_x | bypass_x | regular_y | bypass_y |

*Fig. 3A*  *Prior Art*

| 0000 | 11 | 0000 | 10 |
|---|---|---|---|
| regular_x | bypass_x | regular_y | bypass_y |

| 0000 | 0000 | 11 | 10 |
|---|---|---|---|
| regular_x | regular_y | bypass_x | bypass_y |

*Fig. 3B*

| 0000 | 11 | 0000 | 10 |
|---|---|---|---|
| regular_x | bypass_x | regular_y | bypass_y |

| 10 | 11 | 0000 | 0000 |
|---|---|---|---|
| bypass_y | bypass_x | regular_y | regular_x |

METHOD AND APPARATUS FOR REORDERED BINARIZATION OF SYNTAX ELEMENTS IN CABAC

CROSS REFERENCE TO RELATED APPLICATIONS

The present invention claims priority to U.S. Provisional Patent Application Ser. No. 61/514,986, filed Aug. 4, 2011, entitled "Reordered binarization of last_significant_coeff_x and last_significant_coeff_y". The U.S. Provisional Patent Application is hereby incorporated by reference in its entirety.

FIELD OF INVENTION

The present invention relates to video coding or video processing. In particular, the present invention relates to reordering binarization results consisting of regular bins and bypass bins in Context-Based Adaptive Binary Arithmetic Coding (CABAC).

BACKGROUND OF THE INVENTION

The arithmetic coding is known as one of the efficient data compressing methods and is widely used in coding standards, such as JBIG, JPEG2000, H.264/AVC, and High-Efficiency Video Coding (HEVC). In H.264/AVC JVT Test Model (JM) and HEVC Test Model (HM), Context-Based Adaptive Binary Arithmetic Coding (CABAC) is adopted as the entropy coding tool for various syntax elements in the video coding system.

Figure 1:
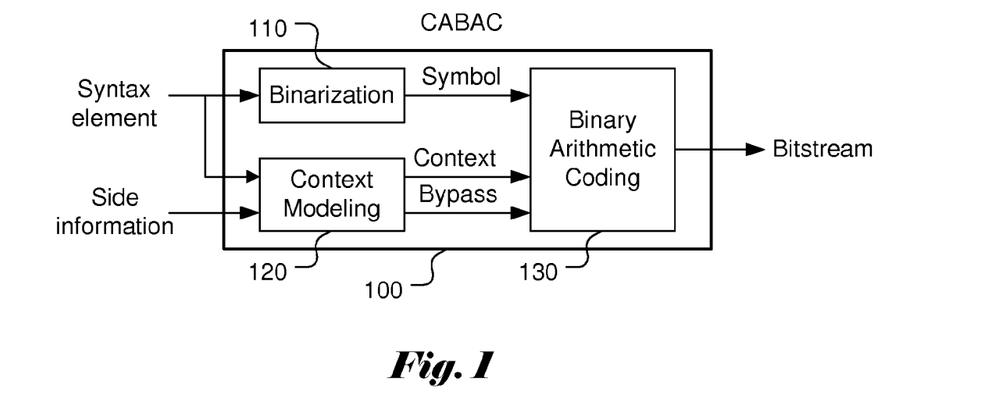
FIG. 1 illustrates exemplary architecture of CABAC encoding system with a bypass mode.

FIG. 1 illustrates an example of CABAC encoder 100 which includes three parts: Binarization 110, Context Modeling 120, and Binary Arithmetic Coding (BAC) 130. In the binarization step, each syntax element is uniquely mapped into a binary string (also called bin or bins in this disclosure). In the context modeling step, a probability model is selected for each bin. The corresponding probability model may depend on previously encoded syntax elements, bin indexes, side information, or any combination of the above. After the binarization and the context model assignment, a bin value along with its associated context model is provided to the binary arithmetic coding engine, i.e., the BAC 130 block in FIG. 1. The bin value can be coded in two coding modes depending on the syntax element and bin indexes, where one is the regular coding mode, and the other is the bypass mode. The bins corresponding to regular coding mode are referred to as regular bins and the bins corresponding to bypass coding mode are referred to as bypass bins in this disclosure. In the regular coding mode, the probability of the Most Probable Symbol (MPS) and the probability of the Least Probable Symbol (LPS) for BAC are derived from the associated context model. In the bypass coding mode, the probability of the MPS and the LPS are equal. In CABAC, the bypass mode is introduced to speed up the encoding process.

The simplicity of the bypass coding mode allows the encoding/decoding of the CABAC to be implemented in parallel architecture and to achieve high throughput. However, the encoding/decoding throughput for the regular coding mode cannot be accelerated efficiently due to the complex derivation process of the probability of MPS and LPS. For hardware-based CABAC, the throughput based on a series of regular bins followed by a series of bypass bins is higher than the throughput associated with interleaved regular bins and bypass bins. Therefore, reordering the binarization of syntax elements to collect the bypass bins together can improve the encoding and decoding throughput. In High-Efficiency Video Coding Test Model Version 4.0 (HM-4.0), the binarization of certain syntax elements, such as mvd_l0, mvd_l1, mvd_lc, and coeff_abs_level_minus3, has collected the bypass bins together.

In HM-4.0, for leaf Transform Units (TU) larger than 4×4, the binarization result of last_significant_coeff_x and last_significant_coeff_y can be classified into two parts, one part is processed according to the regular mode and the other part is processed according to the bypass mode. For a leaf TU with width W, if the value of last_significant_coeff_x or last_significant_coeff_y is smaller than W/2, the codeword is binarized with unary code. An exemplary binarization of last_significant_coeff_x and last_significant_coeff_y for an 8×8 TU is shown in Table 1. These unary codes are coded in a regular mode. If the value of last_significant_coeff_x or last_significant_coeff_y is equal to or larger than W/2, the binarized code word is classified into two parts, as shown in Table 1. The first part consists of W/2 bits of zeros which is coded in the regular mode. The second part is log 2(W/2) bits of fixed-length codeword of the value of last_significant_coeff_x or last_significant_coeff_y minus W/2. These fixed-length codes are coded in bypass mode.

TABLE 1

| Value | Binarized codeword | Unary codeword Part (regular mode) | Fixed-length codeword Part (bypass mode) |
| --- | --- | --- | --- |
| 0 | 1 | 1 | |
| 1 | 01 | 01 | |
| 2 | 001 | 001 | |
| 3 | 0001 | 0001 | |
| 4 | 000000 | 0000 | 00 |
| 5 | 000001 | 0000 | 01 |
| 6 | 000010 | 0000 | 10 |
| 7 | 000011 | 0000 | 11 |

It is desirable to further improve the encoding/decoding throughput of CABAC that incorporates a bypass mode.

SUMMARY OF THE INVENTION

A method and apparatus for context-based adaptive binary arithmetic encoding/decoding for syntax elements of one or more blocks are disclosed. According to one embodiment of the present invention, the binarization results of the x and y positions of the last significant coefficient of a transform unit are reordered by collecting the bypass bins together. Furthermore, the above reordering can be used for binarization results corresponding to a block and its neighboring blocks. According to another embodiment of the present invention, binarization results of syntax elements from two or more of four N×N prediction units, including prev_intra_luma_pred_ flag, rem_intra_luma_pred_mode, and mpm_idx are reordered by collecting the bypass bins together. Furthermore, the above reordering can be used for binarization results corresponding to all four N×N prediction units. In yet another embodiment according to the present invention, the binarization results of one or more members from a syntax element group consisting of syntax associated with SAO parameters, ALF parameters, coding unit parameters, mode coding parameters, motion parameters, and coefficient coding are reordered by collecting the bypass bins together. Also, the above reordering can be used for binarization results of one or more syntax elements from a block and its neighboring blocks.

DETAILED DESCRIPTION

Figure 2:
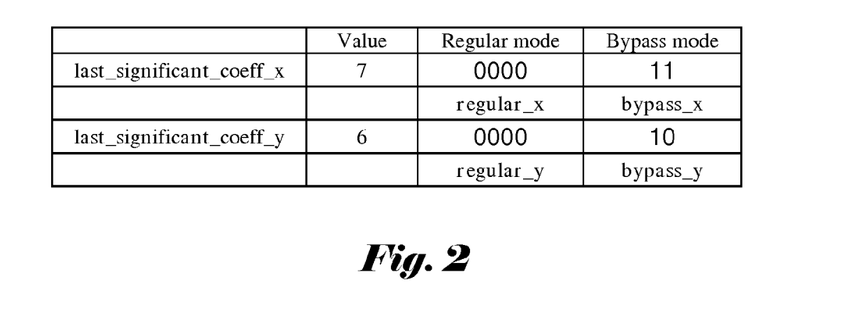
FIG. 2 illustrates exemplary codewords for syntax elements last_significant_coeff_x and last_significant_coeff_y of 8×8 coding unit.
Figure 3A:
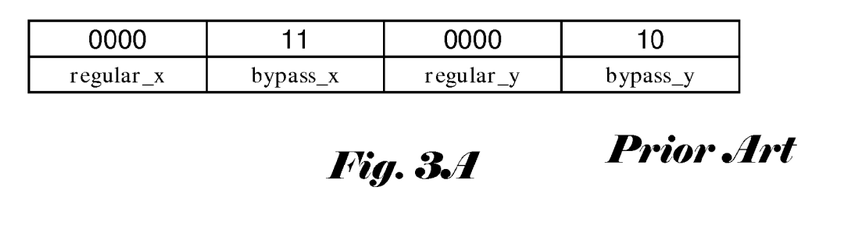
FIG. 3A illustrates last_significant_coeff_x and last_significant_coeff_y binarization results according to HM-4.0, which results in interleaved regular bins and bypass bins.
Figure 3B:
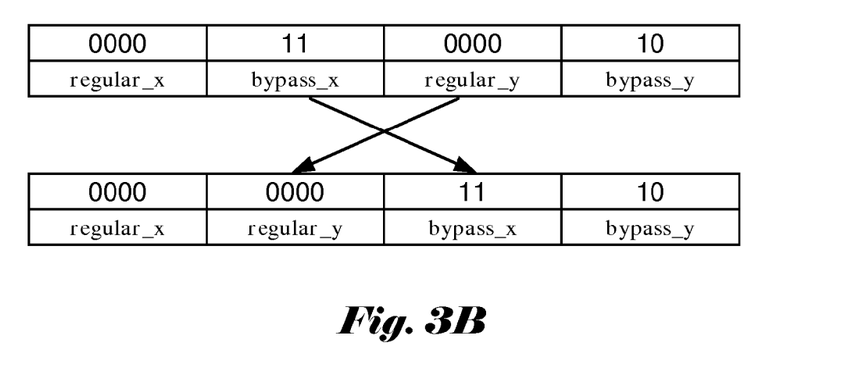
FIG. 3B illustrates an example of reordering the binarization results of last_significant_coeff_x and last_significant_coeff_y to collect the bypass bins together according to an embodiment of the present invention.

One embodiment of the present invention improves the encoding/decoding throughput by reordering binarization results of last_significant_coeff_x and last_significant_coeff_y to collect the bypass bins together. After binarization of last_significant_coeff_x and last_significant_coeff_y, the corresponding binarization results are reordered so that the bypass mode bins corresponding to these two syntax elements will be adjacent to each other. Also, the regular bins corresponding to these two syntax elements will also be adjacent to each other. FIG. 2 illustrates an exemplary binarization results for an 8×8 TU according to HM-4.0, where the binarization result of last_significant_coeff_x with a value of 7 is 000011. The first four bits, i.e., 0000 are coded in the regular mode and the last two bits, i.e., 11 are coded in the bypass mode. The binarization result of last_significant_coeff_y having a value of 6 is 000010. The first four bits, i.e., 0000 are coded in the regular mode and the last two bits, i.e., 10 are coded in the bypass mode. According to HM-4.0, the last_significant_coeff_x and last_significant_coeff_y are coded sequentially, which result in interleaved regular bins and bypass bins as shown in FIG. 3A. On the other hand, an embodiment of the present invention reorders the binarization results of last_significant_coeff_x and last_significant_coeff_y to collect the bypass bins together as shown in FIG. 3B. Accordingly, the reordered binarization results have the following arrangement: regular_x, regular_y, bypass_x and bypass_y, where these parts correspond to regular parts and bypass parts for last_significant_coeff_x and last_significant_coeff_y respectively.

Figure 3C:
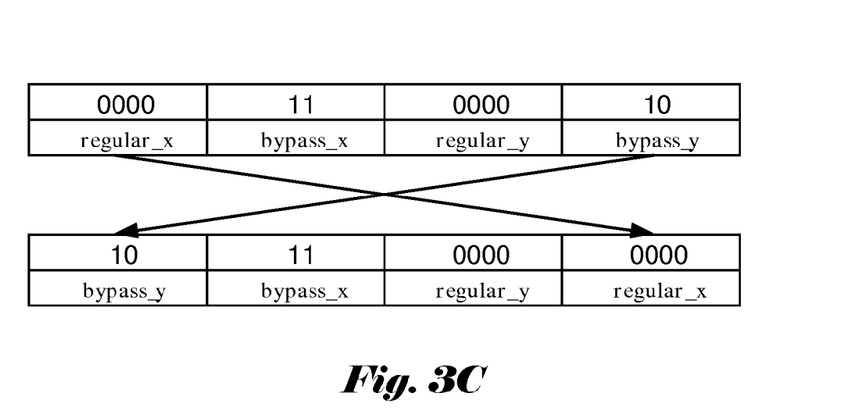
FIG. 3C illustrates an example of reordering the binarization results of last_significant_coeff_x and last_significant_coeff_y to collect the bypass bins together according to another embodiment of the present invention.

While an exemplary reordering of binarization result is illustrated for an 8×8 TU (Transform Unit), embodiments according to the present invention can be applied to TUs of other sizes. Furthermore, the exemplary reordering as shown in FIG. 3B results in an ordered binarization as regular_x, regular_y, bypass_x and bypass_y. Other reordering may also be used to generate consecutive regular bins and/or consecutive bins. For example, the bin locations for regular_x and bypass_y can be switched to cause consecutive regular bins and consecutive bins as shown in FIG. 3C. FIG. 3B illustrates an example of reordering the binarization results of last_significant_coeff_x and last_significant_coeff_y to collect the bypass bins together according to an embodiment of the present invention. FIG. 3C illustrates an example of reordering the binarization results of last_significant_coeff_x and last_significant_coeff_y to collect the bypass bins together according to another embodiment of the present invention.

While the binarization result for each syntax element in FIG. 2 consists of regular bins as well as bypass bins, the present invention can also be applied to binarization results containing only regular bins, only bypass bins, or both regular bins and bypass bins. For example, the binarization result for syntax A may consist of two parts, where one part belongs to regular bins, regular_A and the other part belongs to bypass bins, bypass_A. The binarization result for syntax B may consist of bypass bins, bypass_B only. An embodiment according to the present invention reorders the binarization results by grouping bypass bins from bypass_A and bypass_B. The ordering can also be applied to syntax A and syntax B from multiple blocks. For example, bypass_A and bypass_B from multiple blocks can be grouped together. Similarly, the regular bins for regular_A from multiple blocks can also be grouped together. In another example, the syntax element of the block further comprises syntax C and the binarization result for syntax C may consist of bypass bins, bypass_C only.

An embodiment according to the present invention may reorder the binarization results for syntax elements A, B, and C by collecting bypass bins together and the regular bins together. For example, the reordered binarization results may be as regular_A, regular_B, bypass_A and bypass_C. Other reordering may also be used to collect bypass bins together and/or regular bins together. For example, the reordering corresponding to bypass_A, bypass_C, regular_A, and regular_B also groups bypass bins together and regular bins together. Furthermore, the reordering may be applied to syntax elements from multiple blocks. The above syntax element A and B or syntax elements A, B and C can be selected from a syntax element group consisting of syntax associated with SAO parameters, ALF parameters, coding unit parameters, mode coding parameters, motion parameters, and coefficient coding for a coding system. Typically, each coding system defines a set of syntax for the system. For example, in HM-5.0 (WD5: Working Draft 5 of High-Efficiency Video Coding, Bross, et. al., Joint Collaborative Team on Video Coding (JCT-VC) of ITU-T SG16 WP3 and ISO/IEC JTC1/SC29/WG11, 7th Meeting: Geneva, CH, 21-30 Nov., 2011, Document: JCTVC-G1103), SAO parameters include sao_merge_left_flag, sao_merge_up_flag, sao_type_idx, sao_band_position, sao_offset_abs, and sao_offset_sign; ALF parameters include alf_cu_flag; coding unit parameters include split_coding_unit_flag, cu_qp_delta, end_of_slice_flag; mode coding parameters include skip_flag, cu_transquant_bypass_flag, part_mode, pred_mode_flag, pcm_flag, pred_type, prev_intra_luma_pred_flag, rem_intra_luma_pred_mode, mpm_idx, intra_chroma_pred_mode, motion parameters include merge_flag, merge_idx, inter_pred_flag, ref_idx_lc, ref_idx_l0, ref_idx_l1, mvp_idx_lc, mvp_idx_l0, mvp_idx_l1; and coefficient coding include transform_skip_flag, split_transform_flag, significant_coeff_group_flag, no_residual_data_flag, cbf_luma, cbf_cb, cbf_cr, last_significant_coeff_x, last_significant_coeff_y, significant_coeff_flag, coeff_abs_level_greater1_flag, coeff_abs_level_greater2_flag. While HM-5.0 syntax is illustrated as an example of the syntax element group for practicing the present invention, a person skilled in the art may use different syntax names or syntax element to practice the present invention without departing from the spirit of the present invention.

In yet another embodiment of the present invention, the reordering of binarization results is applied to CABAC coding for an Intra_N×N Coding Unit (CU), where the CU is partitioned into four Intra N×N Prediction Units (PUs). Syntax elements associated with the four Intra_N×N PUs coding comprise prev_intra_luma_pred_flag, rem_intra_luma_pred_mode and mpm_idx. When prev_intra_luma_pred_flag has a value of 1, syntax element mpm_idx is incorporated. When prev_intra_luma_pred_flag has a value of 0, syntax element rem_intra_luma_pred_mode is incorporated. The prev_intra_luma_pred_flag is binarized and the binarization results are coded according to the regular coding mode while the rem_intra_luma_pred_mode and mpm_idx are binarized and the binarization results are coded according to the bypass coding mode. The binarized results can be reordered to cause bypass bins corresponding to different syntax elements to be grouped together. The reordering can be applied to the syntax elements from two or more Intra N×N PUs. For example, bypass bins corresponding to binarization results associated with rem_intra_luma_pred_mode and mpm_idx from four Intra N×N PUs can be grouped together. The binarization results corresponding to regular bins associated with syntax element, prev_intra_luma_pred_flag from four N×N PUs can also be grouped into consecutive bins. In the reordered bins, the group of bins associated with binarization results for both rem_intra_luma_pred_mode and mpm_idx from two or more Intra N×N PUs can be before or after the group of bins associated with binarization results for prev_intra_luma_pred_flag from two or more Intra N×N PUs. When reordering is applied to four PUs, bypass bins associated with the four PUs may correspond to four rem_intra_luma_pred_mode's, four mpm_idx's, or any mix of rem_intra_luma_pred_mode's and mpm_idx's, depending on prev_intra_luma_pred_flag's.

Figure 4:
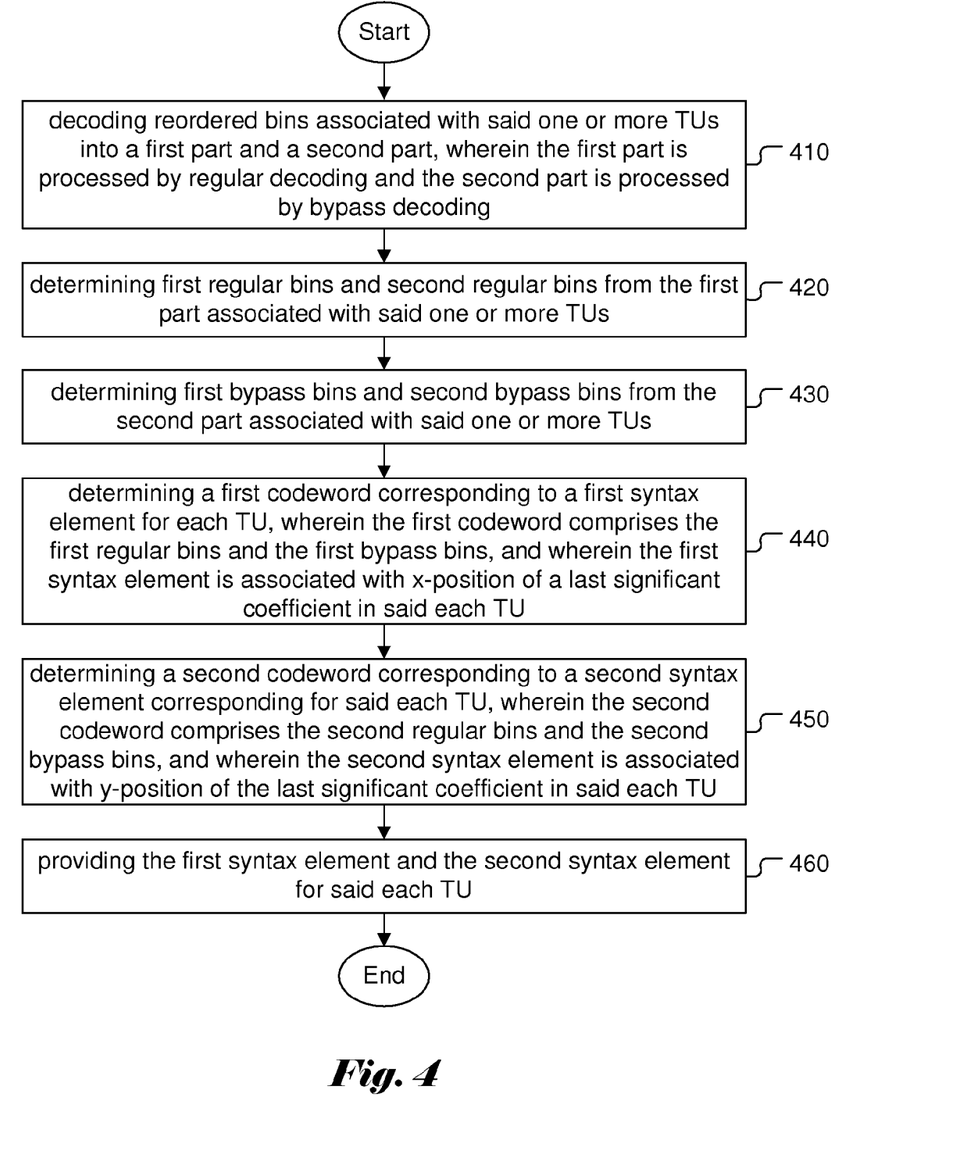
FIG. 4 illustrates an exemplary flow chart of a CABAC decoding system according to one embodiment of the present invention for the x and y positions of last significant coefficient of a transform unit.

FIG. 4 illustrates an exemplary flow chart of a CABAC decoding system according to one embodiment of the present invention for the x and y positions of last significant coefficient of a transform unit. The decoder will decode reordered bins associated with one or more TUs into a first part and a second part, wherein the first part is processed by regular decoding and the second part is processed by bypass decoding as shown in step 410. The first regular bins and second regular bins are then determined from the first part associated with said one or more TUs as shown in step 420. The first bypass bins and second bypass bins are determined from the second part associated with said one or more TUs as shown in step 430. A first codeword corresponding to a first syntax element for each TU is determined, wherein the first codeword comprises the first regular bins and the first bypass bins, and wherein the first syntax element is associated with x-position of a last significant coefficient in said each TU as shown in step 440. A second codeword corresponding to a second syntax element corresponding for said each TU is determined, wherein the second codeword comprises the second regular bins and the second bypass bins, and wherein the second syntax element is associated with y-position of the last significant coefficient in said each TU as shown in step 450. The first syntax element and the second syntax element for said each TU are then outputted as shown in step 460.

Figure 5:
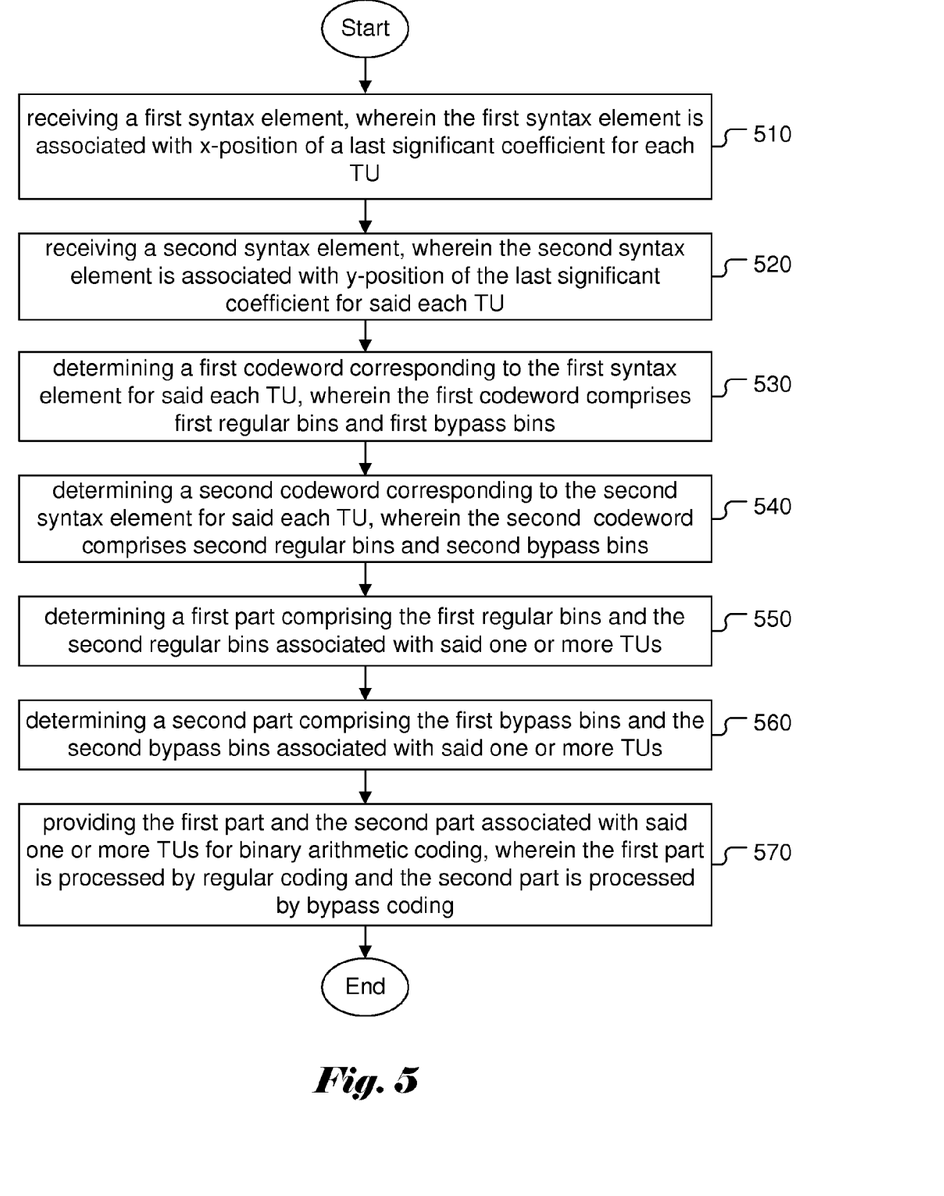
FIG. 5 illustrates an exemplary flow chart of a CABAC encoding system according to one embodiment of the present invention for the x and y positions of last significant coefficient of a transform unit.

FIG. 5 illustrates an exemplary flow chart of a CABAC encoding system according to one embodiment of the present invention for the x and y positions of last significant coefficient of a transform unit. The encoder receives a first syntax element, wherein the first syntax element is associated with x-position of a last significant coefficient for each TU as shown in step 510. The encoder further receives a second syntax element, wherein the second syntax element is associated with y-position of the last significant coefficient for said each TU as shown in step 520. A first codeword corresponding to the first syntax element for said each TU is determined, wherein the first codeword comprises first regular bins and first bypass bins as shown in step 530. A second codeword corresponding to the second syntax element for said each TU is determined, wherein the second codeword comprises second regular bins and second bypass bins as shown in step 540. A first part comprising the first regular bins and the second regular bins associated with said one or more TUs is determined as shown in step 550. A second part comprising the first bypass bins and the second bypass bins associated with said one or more TUs is determined as shown in step 560. The first part and the second part associated with said one or more TUs for binary arithmetic coding are outputted, wherein the first part is processed by regular coding and the second part is processed by bypass coding as shown in step 570.

Figure 6:
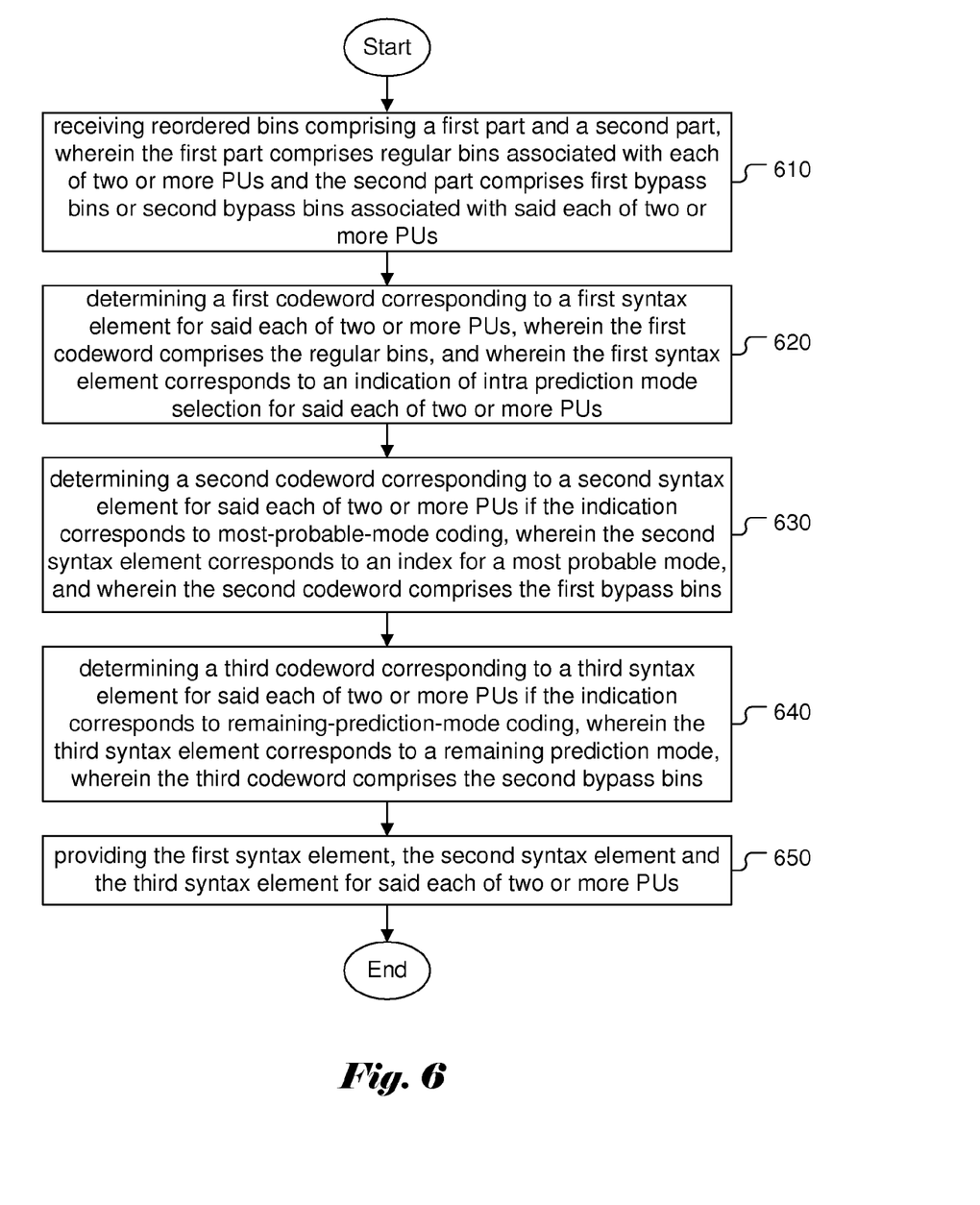
FIG. 6 illustrates an exemplary flow chart of a CABAC decoding system according to one embodiment of the present invention for Intra N×N prediction units.

FIG. 6 illustrates an exemplary flow chart of a CABAC decoding system according to one embodiment of the present invention for Intra N×N prediction units. The decoder receives reordered bins comprising a first part and a second part, wherein the first part comprises regular bins associated with each of two or more PUs and the second part comprises first bypass bins or second bypass bins associated with said each of two or more PUs as shown in step 610. A first codeword corresponding to a first syntax element for said each of two or more PUs is determined, wherein the first codeword comprises the regular bins, and wherein the first syntax element corresponds to an indication of intra prediction mode selection for said each of two or more PUs as shown in step 620. A second codeword corresponding to a second syntax element for said each of two or more PUs if the indication corresponds to most-probable-mode coding, wherein the second syntax element corresponds to an index for a most probable mode is determined, and wherein the second codeword comprises the first bypass bins as shown in step 630. A third codeword corresponding to a third syntax element for said each of two or more PUs if the indication corresponds to remaining-prediction-mode coding, wherein the third syntax element corresponds to a remaining prediction mode is determined, wherein the third codeword comprises the second bypass bins as shown in step 640. The first syntax element, the second syntax element and the third syntax element for said each of two or more PUs are outputted as shown in step 650.

Figure 7:
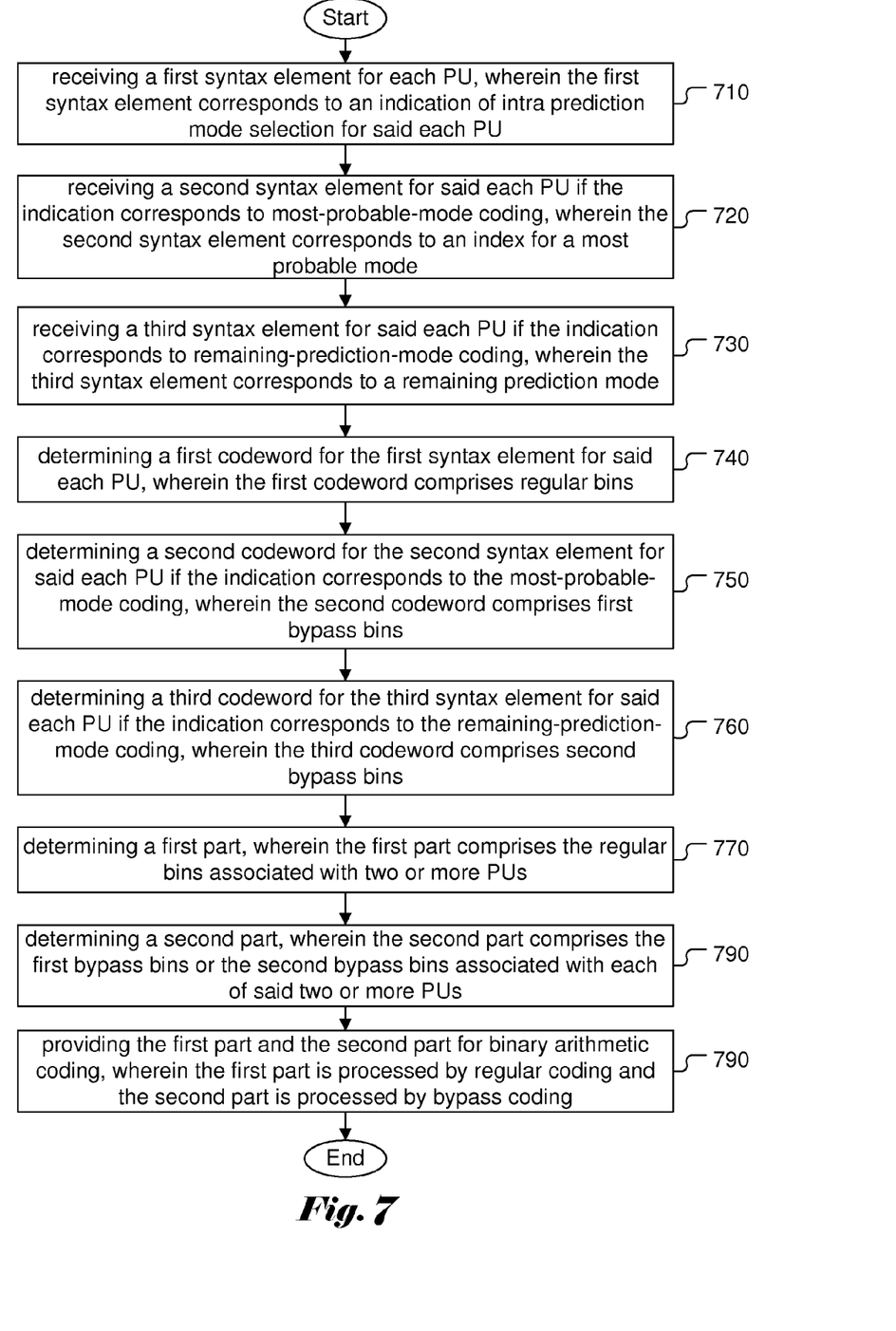
FIG. 7 illustrates an exemplary flow chart of a CABAC encoding system according to one embodiment of the present invention for Intra N×N prediction units.

FIG. 7 illustrates an exemplary flow chart of a CABAC encoding system according to one embodiment of the present invention for Intra N×N prediction units. The encoder receives a first syntax element for each PU, wherein the first syntax element corresponds to an indication of intra prediction mode selection for said each PU as shown in step 710. The encoder then receives a second syntax element for said each PU if the indication corresponds to most-probable-mode coding, wherein the second syntax element corresponds to an index for a most probable mode as shown in step 720. The encoder further receives a third syntax element for said each PU if the indication corresponds to remaining-prediction-mode coding, wherein the third syntax element corresponds to a remaining prediction mode as shown in step 730. A first codeword for the first syntax element for said each PU is determined, wherein the first codeword comprises regular bins as shown in step 740. A second codeword for the second syntax element for said each PU if the indication corresponds to the most-probable-mode coding is determined, wherein the second codeword comprises first bypass bins as shown in step 750. A third codeword for the third syntax element for said each PU if the indication corresponds to the remaining-prediction-mode coding is determined, wherein the third codeword comprises second bypass bins as shown in step 760. A first part is determined, wherein the first part comprises the regular bins associated with two or more PUs as shown in step 770. A second part is determined, wherein the second part comprises the first bypass bins or the second bypass bins associated with each of said two or more PUs as shown in step 780. The first part and the second part for binary arithmetic coding are outputted, wherein the first part is processed by regular coding and the second part is processed by bypass coding as shown in step 790.

Figure 8:
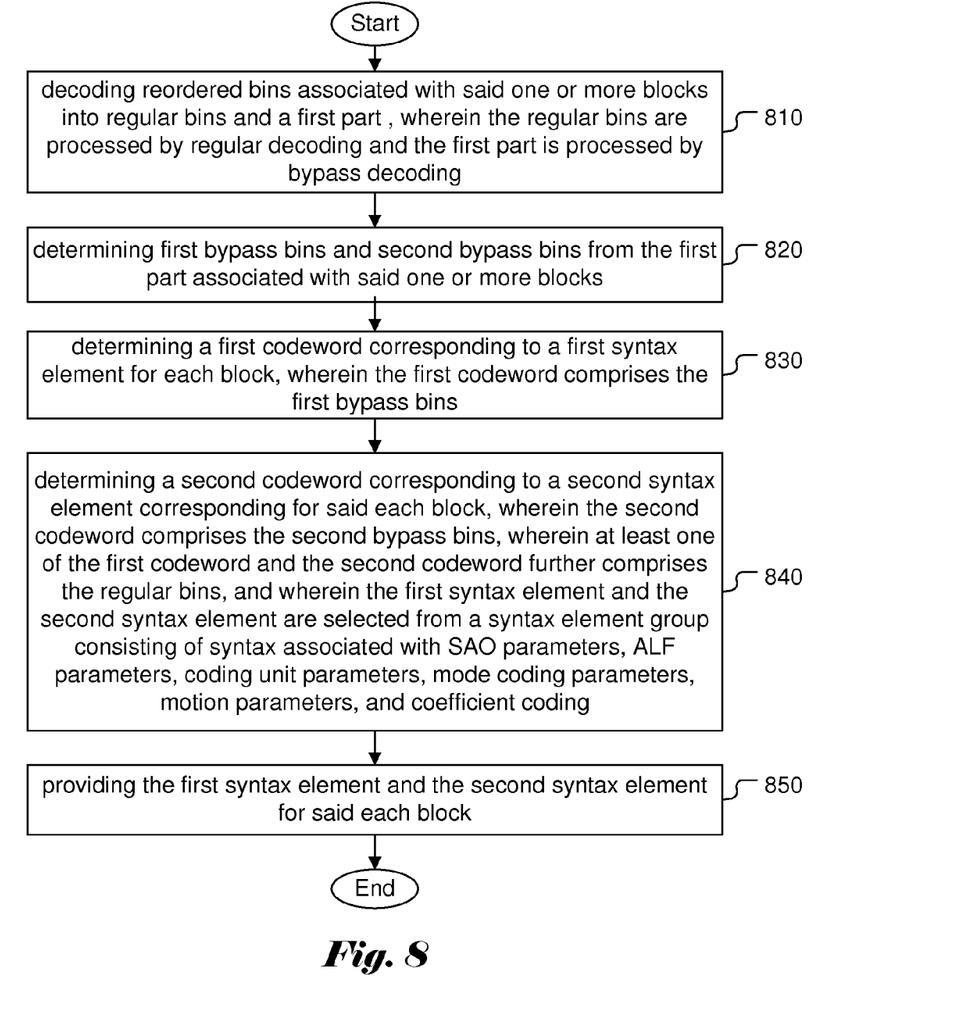
FIG. 8 illustrates an exemplary flow chart of a CABAC decoding system according to one embodiment of the present invention for various syntax elements of one or more blocks.

FIG. 8 illustrates an exemplary flow chart of a CABAC decoding system according to one embodiment of the present invention for various syntax elements of one or more blocks. The decoder decodes reordered bins associated with said one or more blocks into regular bins and a first part, wherein the regular bins are processed by regular decoding and the first part is processed by bypass decoding as shown in step 810. The first bypass bins and second bypass bins from the first part associated with said one or more blocks are determined as shown in step 820. A first codeword corresponding to a first syntax element for each block is determined, wherein the first codeword comprises the first bypass bins as shown in step 830. A second codeword corresponding to a second syntax element corresponding for said each block, wherein the second codeword comprises the second bypass bins, wherein at least one of the first codeword and the second codeword further comprises the regular bins, and wherein the first syntax element and the second syntax element are selected from a syntax element group consisting of syntax associated with SAO parameters, ALF parameters, coding unit parameters, mode coding parameters, motion parameters, and coefficient coding for a coding system as shown in step 840. Again, HM-5.0 syntax may be used as an example of the syntax element group for practicing the present invention. The first syntax element and the second syntax element for said each block are outputted as shown in step 850.

Figure 9:
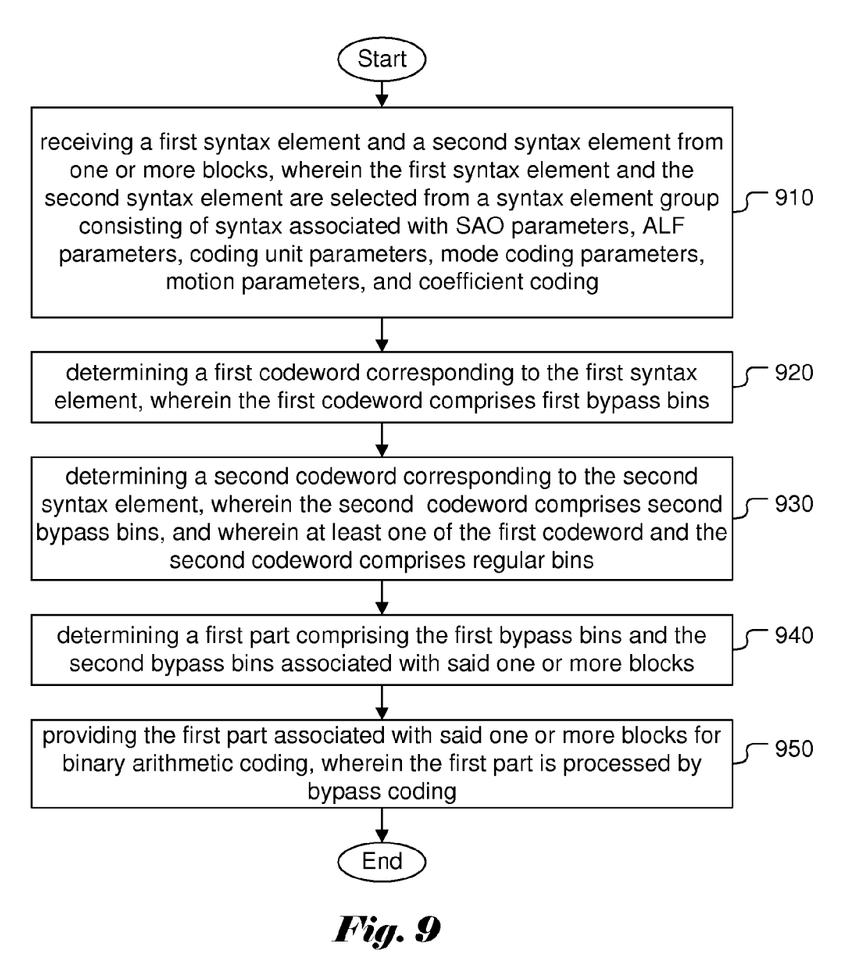
FIG. 9 illustrates an exemplary flow chart of a CABAC encoding system according to one embodiment of the present invention for various syntax elements of one or more blocks.

FIG. 9 illustrates an exemplary flow chart of a CABAC encoding system according to one embodiment of the present invention for various syntax elements of one or more blocks. The encoder receives a first syntax element and a second syntax element from one or more blocks, wherein the first syntax element and the second syntax element are selected from a syntax element group consisting of syntax associated with SAO parameters, ALF parameters, coding unit parameters, mode coding parameters, motion parameters, and coefficient coding for a coding system as shown in step 910. Again, HM-5.0 syntax may be used as an example of the syntax element group for practicing the present invention. A first codeword corresponding to the first syntax element is determined, wherein the first codeword comprises first bypass bins as shown in step 920. A second codeword corresponding to the second syntax element is determined, wherein the second codeword comprises second bypass bins, and wherein at least one of the first codeword and the second codeword comprises regular bins as shown in step 930. A first part comprising the first bypass bins and the second bypass bins associated with said one or more blocks is determined as shown in step 940. The first part associated with said one or more blocks for binary arithmetic coding is outputted, wherein the first part is processed by bypass coding as shown in step 950.

The above description is presented to enable a person of ordinary skill in the art to practice the present invention as provided in the context of a particular application and its requirement. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed. In the above detailed description, various specific details are illustrated in order to provide a thorough understanding of the present invention. Nevertheless, it will be understood by those skilled in the art that the present invention may be practiced.

Embodiment of reordering of binarization results to cause bypass bins together according to the present invention as described above may be implemented in various hardware, software codes, or a combination of both. For example, an embodiment of the present invention can be a circuit integrated into a video compression chip or program codes integrated into video compression software to perform the processing described herein. An embodiment of the present invention may also be program codes to be executed on a Digital Signal Processor (DSP) to perform the processing described herein. The invention may also involve a number of functions to be performed by a computer processor, a digital signal processor, a microprocessor, or field programmable gate array (FPGA). These processors can be configured to perform particular tasks according to the invention, by executing machine-readable software code or firmware code that defines the particular methods embodied by the invention. The software code or firmware codes may be developed in different programming languages and different formats or styles. The software code may also be compiled for different target platforms. However, different code formats, styles and languages of software codes and other means of configuring code to perform the tasks in accordance with the invention will not depart from the spirit and scope of the invention.

The invention may be embodied in other specific forms without departing from its spirit or essential characteristics. The described examples are to be considered in all respects only as illustrative and not restrictive. The scope of the invention is therefore, indicated by the appended claims rather than by the foregoing description. All changes which come within the meaning and range of equivalency of the claims are to be embraced within their scope.

The invention claimed is:

1. A method of context-based adaptive binary arithmetic decoding for syntax elements of a coding unit, wherein the coding unit is partitioned into four PUs (prediction units) in an N×N intra prediction mode, the method comprising:
   receiving in a circuit reordered bins comprising a first part and a second part, wherein the first part comprises regular bins associated with each of two or more PUs and the second part comprises first bypass bins or second bypass bins associated with said each of two or more PUs, wherein the first bypass bins are reordered by collecting bypass bins related to an index for a most probable mode associated with said two or more PUs together and the second bypass bins are reordered by collecting bypass bins related to a remaining prediction mode associated with said two or more PUs together;
   determining in a circuit a first codeword corresponding to a first syntax element for said each of two or more PUs, wherein the first codeword comprises the regular bins, and wherein the first syntax element corresponds to an indication of intra prediction mode selection for said each of two or more PUs;
   determining in a circuit a second codeword corresponding to a second syntax element for said each of two or more PUs if the indication corresponds to most-probable-mode coding, wherein the second syntax element corresponds to the index for a most probable mode, and wherein the second codeword comprises the first bypass bins;
   determining in a circuit a third codeword corresponding to a third syntax element for said each of two or more PUs if the indication corresponds to remaining-prediction-mode coding, wherein the third syntax element corresponds to the remaining prediction mode, wherein the third codeword comprises the second bypass bins; and
   providing by a circuit the first syntax element, the second syntax element and the third syntax element for said each of two or more PUs.

2. The method of claim 1, wherein the first part comprises the regular bins associated with said four PUs, and wherein the second part comprises the first bypass bins or the second bypass bins associated with each of said four PUs.

3. A method of context-based adaptive binary arithmetic coding for syntax elements of a coding unit, wherein the coding unit is partitioned into four PUs (prediction units) in an N×N intra prediction mode, the method comprising:
   receiving in a circuit a first syntax element for each PU, wherein the first syntax element corresponds to an indication of intra prediction mode selection for said each PU;
   receiving in a circuit a second syntax element for said each PU if the indication corresponds to most-probable-mode coding, wherein the second syntax element corresponds to an index for a most probable mode;
   receiving in a circuit a third syntax element for said each PU if the indication corresponds to remaining-prediction-mode coding, wherein the third syntax element corresponds to a remaining prediction mode;
   determining in a circuit a first codeword for the first syntax element for said each PU, wherein the first codeword comprises regular bins;
   determining in a circuit a second codeword for the second syntax element for said each PU if the indication corresponds to the most-probable-mode coding, wherein the second codeword comprises reordered first bypass bins;
   determining in a circuit a third codeword for the third syntax element for said each PU if the indication corresponds to the remaining-prediction-mode coding, wherein the third codeword comprises reordered second bypass bins;
   determining in a circuit a first part, wherein the first part comprises the regular bins associated with two or more PUs;
   determining in a circuit a second part, wherein the second part comprises the first bypass bins or the second bypass bins associated with each of said two or more PUs, wherein the first bypass bins are reordered by collecting bypass bins related to the index for a most probable mode associated with said two or more PUs together and the second bypass bins are reordered by collecting bypass bins related to the remaining prediction mode associated with said two or more PUs together; and
   providing by a circuit the first part and the second part for binary arithmetic coding, wherein the first part is processed by regular coding and the second part is processed by bypass coding.

4. The method of claim 3, wherein the first part comprises the regular bins associated with said four PUs, and wherein the second part comprises the first bypass bins or the second bypass bins associated with each of said four PUs.

5. A device for context-based adaptive binary arithmetic decoding for syntax elements of a coding unit, wherein the coding unit is partitioned into four PUs (prediction units) in an N×N intra prediction mode, the device comprising:
   a first interface circuit configured to receive reordered bins comprising a first part and a second part, wherein the first part comprises regular bins associated with each of two or more PUs and the second part comprises first bypass bins or second bypass bins associated with said each of two or more PUs, wherein the first bypass bins are reordered by collecting bypass bins related to an index for a most probable mode associated with said two or more PUs together and the second bypass bins are reordered by collecting bypass bins related to a remaining prediction mode associated with said two or more PUs together;
   a first circuit configured to determine a first codeword corresponding to a first syntax element for said each of two or more PUs, wherein the first codeword comprises the regular bins, and wherein the first syntax element corresponds to an indication of intra prediction mode selection for said each of two or more PUs;
   a second circuit configured to determine a second codeword corresponding to a second syntax element for said each of two or more PUs if the indication corresponds to most-probable-mode coding, wherein the second syntax element corresponds to the index for a most probable mode, and wherein the second codeword comprises the first bypass bins;
   a third circuit configured to determine a third codeword corresponding to a third syntax element for said each of two or more PUs if the indication corresponds to remaining-prediction-mode coding, wherein the third syntax element corresponds to the remaining prediction mode, wherein the third codeword comprises the second bypass bins; and
   a second interface circuit configured to provide the first syntax element, the second syntax element and the third syntax element for said each of two or more PUs.

6. The device of claim 5, wherein two or more of the first circuit, the second circuit, the third circuit, the first interface circuit, and the second interface circuit are implemented by an integrated circuit.

7. A device for context-based adaptive binary arithmetic coding for syntax elements of a coding unit, wherein the coding unit is partitioned into four PUs (prediction units) in an N×N intra prediction mode, the device comprising:

a first interface circuit configured to receive a first syntax element for each PU, wherein the first syntax element corresponds to an indication of intra prediction mode selection for said each PU;

a second interface circuit configured to receive a second syntax element for said each PU if the indication corresponds to most-probable-mode coding, wherein the second syntax element corresponds to an index for a most probable mode;

a third interface circuit configured to receive a third syntax element for said each PU if the indication corresponds to remaining-prediction-mode coding, wherein the third syntax element corresponds to a remaining prediction mode;

a first circuit configured to determine a first codeword for the first syntax element for said each PU, wherein the first codeword comprises regular bins;

a second circuit configured to determine a second codeword for the second syntax element for said each PU if the indication corresponds to the most-probable-mode coding, wherein the second codeword comprises reordered first bypass bins;

a third circuit configured to determine a third codeword for the third syntax element for said each PU if the indication corresponds to the remaining-prediction-mode coding, wherein the third codeword comprises reordered second bypass bins;

a fourth circuit configured to determine a first part, wherein the first part comprises the regular bins associated with two or more PUs;

a fifth circuit configured to determine a second part, wherein the second part comprises the first bypass bins or the second bypass bins associated with each of said two or more PUs; and a fourth interface circuit configured to provide the first part and the second part for binary arithmetic coding, wherein the first part is processed by regular coding and the second part is processed by bypass coding, wherein the first bypass bins are reordered by collecting bypass bins related to the index for a most probable mode associated with said two or more PUs together and the second bypass bins are reordered by collecting bypass bins related to the remaining prediction mode associated with said two or more PUs together.

8. The device of claim 7, wherein two or more of the first circuit, the second circuit, the third circuit, the fourth circuit, the fifth circuit, the first interface circuit, the second interface circuit, the third interface circuit, and the fourth interface circuit are implemented by an integrated circuit.

* * * * *